United States Patent [19]
Ueda et al.

[11] Patent Number: 5,541,007
[45] Date of Patent: Jul. 30, 1996

[54] ALUMINUM ALLOY WIRING LAYER AND ALUMINUM ALLOY SPUTTERING TARGET

[75] Inventors: Tadao Ueda, Komae; Kazunari Takemura, Joetsu, both of Japan

[73] Assignee: Mitsubishi Chemical Corporation, Japan

[21] Appl. No.: 277,073

[22] Filed: Jul. 19, 1994

Related U.S. Application Data

[63] Continuation-in-part of Ser. No. 923,935, filed as PCT/JP92/00034, Jan. 17, 1992, abandoned.

[30] Foreign Application Priority Data

Jan. 17, 1991 [JP] Japan ........................ 3-17109

[51] Int. Cl.$^6$ ............ B32B 15/20; C22C 21/00; C22F 1/04
[52] U.S. Cl. ............ 428/650; 148/437; 420/528; 428/620
[58] Field of Search ............ 428/650, 651, 428/652, 653, 654, 620; 204/192.15, 192.17, 298.13; 148/437; 420/528

[56] References Cited

U.S. PATENT DOCUMENTS

| | | | |
|---|---|---|---|
| 3,619,181 | 11/1971 | Willey | 420/538 |
| 4,080,223 | 3/1978 | Schoerner et al. | 420/542 |
| 4,154,874 | 5/1979 | Howard | 427/91 |
| 4,874,440 | 10/1989 | Sawtell et al. | 148/437 |
| 5,133,931 | 7/1992 | Cho | 420/541 |

FOREIGN PATENT DOCUMENTS

| | | |
|---|---|---|
| 0249256 | 12/1987 | European Pat. Off. . |
| 52-52585 | 4/1977 | Japan . |
| 1-289140 | 11/1989 | Japan . |

OTHER PUBLICATIONS

Database WPI, Section Ch, Week 7112, Derwent Publications Ltd., London, GB Class L03, An 71–212605 & JP-A-46 011 607 (Matsushita Electric Ind).
International Search Report, Apr. 21, 1992 PCT/JP92/00034.
Translation of Japanese Kokai 1–289140, Arita et al., Nov. 21, 1989, pp. 1–33.

*Primary Examiner*—John Zimmerman
*Attorney, Agent, or Firm*—Nixon & Vanderhye

[57] ABSTRACT

An aluminum alloy wiring layer comprising 0.01 to 1.0 wt. % of scandium, or 0.01 to 1.0 wt. % of scandium and 0.01 to 3.0 wt. % of at least one element selected from the group consisting of silicon, titanium, copper, boron, hafnium and rare-earth elements other than scandium, and the balance aluminum having a purity of not less than 99.99%. A process for producing the same and an aluminum alloy sputtering target used therefor are also disclosed. The aluminum alloy wiring layer of the present invention is suitable as an advanced large-scale integrated circuit.

8 Claims, 3 Drawing Sheets

ALUMINUM ALLOY WIRING LAYER AND ALUMINUM ALLOY SPUTTERING TARGET

CROSS REFERENCE TO RELATED APPLICATIONS

This is a continuation-in-part of application Ser. No. 07/923,935, filed Sep. 4, 1992, now abandoned, which is a national phase of International Application No. PCT/JP92/00034, filed Jan. 17, 1992.

TECHNICAL FIELD

The present invention relates to an aluminum alloy wiring layer, a method of producing the same and an aluminum alloy sputtering target used for producing the same.

BACKGROUND ART

Semiconductor logic devices including a microprocessor and semiconductor memory devices represented by a DRAM are inevitable as a central processing unit, an internal memory or an external memory of a computer and the like. In the process for producing such a large-scale integrated circuit, development of wiring technique for connecting several million to several ten million semiconductor transistors in one chip with high reliability is very important.

At present, DRAM's of 16 megabits using wiring layers having a width of 0.7 to 0.8 μm and composed of an aluminum alloy material obtained by adding a small amount of silicon (Si) or a small amount of silicon and copper (Cu) to aluminum (Al), are ready for full-scale mass production.

These wiring layers are produced by forming a thin film of about 1 μm in thickness on a silicon wafer by sputtering and forming a minute wiring pattern to the thin film by lithography. In producing these wiring layers, an Al-Si alloy target containing about 1 wt. % of Si or an Al-Si-Cu alloy target containing about 1 wt. % of Si and about 0.5 wt. % of Cu is used.

With the recent development of advanced large-scale integrated circuits following DRAM's of 64 megabits and with the recent development of wiring layers having a narrower width (e.g., 0.3 to 0.6 μm) aimed at increasing the integration and the performance of semiconductor integrated circuits, a wiring technique having higher reliability has been demanded.

Al-Si alloy wiring layers or Al-Si-Cu alloy wiring layers used at present, however, have low reliability because an additive such as silicon precipitate during the manufacturing process and remains on the circuit, or breakage of wire is frequently caused thereby.

The breakage of an aluminum wire is ascribed to phenomena called electromigration and stress migration. The electromigration is a phenomenon in which metal ions are moved in wiring in accordance with an electric field by electric currents in the wiring and this effect causes voids on the grain boundary, thereby resulting in breakage of the wire. The stress migration is a phenomenon of breakage of wire caused by which the tensile stress is produced on the aluminum wire in accordance with the difference in the thermal expansion between the aluminum wire and the barrier film of SiN or the like laminated, thereby producing voids on the grain boundary.

DISCLOSURE OF THE INVENTION

As a result of studies undertaken by the present inventors so as to solve the above-described problems in the prior art, and to provide a wiring layer which scarcely causes breakage of wire and which has a low electrical resistance, the following has been found.

Scandium (Sc) combines with Al to form a minute intermetallic compound ($ScAl_3$), which disperses in Al, thereby producing a wire breakage preventing effect. $ScAl_3$ is different from the intermetallic compound $CuAl_2$ which is formed by combining Cu with Al, thereby not becoming coarse by the heat treatment (400° to 450° C.) which is inevitable after the formation of a thin film.

The heat treatment herein means to an annealing treatment carried out for the purpose of making stable a metal thin film from the amorphous thin film and enhancing the adhesiveness thereof.

The present invention has been achieved on the basis of this finding.

In a first aspect of the present invention, there is provided an aluminum alloy wiring layer comprising 0.01 to 1.0 wt. % of scandium and the balance aluminum having a purity of not less than 99.99%.

In a second aspect of the present invention, there is provided an aluminum alloy wiring layer comprising 0.01 to 1.0 wt. % of scandium, 0.01 to 3.0 wt. % of at least one element selected from the group consisting of silicon, titanium, copper, boron, hafnium and rare-earth elements other than scandium and the balance aluminum having a purity of not less than 99.99%.

In a third aspect of the present invention, there is provided an aluminum alloy sputtering target comprising 0.01 to 1.0 wt. % of scandium and the balance aluminum having a purity of not less than 99.99%.

In a fourth aspect of the present invention, there is provided an aluminum alloy sputtering target comprising 0.01 to 1.0 wt. % of scandium, 0.01 to 3.0 wt. % of at least one element selected from the group consisting of silicon, titanium, copper, boron, hafnium and rare-earth elements other than scandium and the balance aluminum having a purity of not less than 99.99%.

In a fifth aspect of the present invention, there is provided a process for producing an aluminum alloy wiring layer comprising sputtering an aluminum alloy target composed of 0.01 to 1.0 wt. % of scandium and the balance aluminum having a purity of not less than 99.99% or an aluminum alloy target composed of 0.01 to 1.0 wt. % of scandium, 0.01 to 3.0 wt. % of at least one element selected from the group consisting of silicon, titanium, copper, boron, hafnium and rare-earth elements other than scandium, and the balance aluminum having a purity of not less than 99.99%.

The present invention will be explained in detail hereinunder.

In an aluminum alloy sputtering target of the present invention, a high-purity aluminum having a purity of not less than 99.99% is used as a base metal. Such a high-purity aluminum can be obtained by electrolytic refining, fractional crystallization, fractional distillation, crystallization or the like.

In the present invention, 0.01 to 1.0 wt. % of scandium, or 0.01 to 1.0 wt. % of scandium and 0.01 to 3.0 wt. % of at least one element selected from the group consisting of silicon, titanium, copper, boron, hafnium and rare-earth elements other than scandium is added to such a high-purity aluminum.

As the rare-earth elements, yttrium, lanthanum, cerium, praseodymium, neodymium, promethium, samarium, europium, gadolinium and terbium may be exemplified. If the amounts of scandium contained therein and the amount of specific element contained together with scandium are out of the above-described ranges, the object of the present invention does not become to be attained. The particularly preferred scandium content is in the range of 0.05 to 0.6 wt. %.

In the present invention, the aluminum alloy is produced by adding a predetermined amount of scandium, or scandium and specific element to a high-purity aluminum, casting the resultant mixture to obtain an ingot containing not more than 10 ppm of inevitable impurities, and applying the ingot to a heat-treatment, rolling-treatment, and reheat-treatment in order so as to form a material having uniform fine crystals. The uniform fine crystals have an average grain size of 0.1 to 0.5 mm.

The conditions for the respective treatments are selected properly for forming the material having the uniform fine crystals. The heat-treatment is generally carried out at 500° to 550° C. for 10 to 15 hours, rolling-treatment is generally carried out at a reduction ratio of 50 to 90%, and reheat-treatment is generally carried out at 400° to 450° C. for 30 to 60 minutes.

The aluminum alloy material obtained in this way is cut into a shape (e.g., circle, rectangle, and doughnut-like shape in which the central part of the above-mentioned shapes is bored) in accordance with a sputtering apparatus, thereby producing a sputtering target.

An aluminum alloy wiring layer according to the present invention is produced by sputtering using the thus-obtained aluminum alloy sputtering target comprising 0.01 to 1.0 wt. % of scandium and the balance aluminum having a purity of not less than 99.99%, or an aluminum alloy target comprising 0.01 to 1.0 wt. % of scandium, 0.01 to 3.0 wt. % of at least one element selected from the group consisting of silicon, titanium, copper, boron, hafnium and rare-earth elements other than scandium and the balance aluminum having a purity of not less than 99.99%. The known sputtering apparatus and sputtering conditions may be adopted for the sputtering.

BRIEF DESCRIPTION OF THE DRAWINGS

In FIGS. 7 and 8, the symbol B represents a wedge-shaped void, and the reference numeral 1 represents a heating plate, the reference numeral 2 represents a presser plate, the reference numeral 3 represents a heater and the reference numeral 4 represents a wafer.

BEST MODE FOR CARRYING OUT THE INVENTION

The present invention will be explained in more detail with reference to the following example, but it is to be understood that the present invention is not restricted thereto.

The measurement of electrical resistance, the electromigration test and the stress migration test in the following example and comparative example were carried out by the following methods.

Measurement of Electrical Resistance

The sheet resistance was measured by an ohmmeter, and after a part of the thin film is dissolved and removed by etching, the thickness of the thin film was measured by a micro step height meter. The resistivity was obtained from the following formula, and this was expressed as the electrical resistance.

Resistivity=(sheet resistance)×(thickness of the thin film)

Electromigration Test

A wafer with a wiring pattern formed thereon was brought into close contact with a heating plate and heated to 200° C. Electrodes were connected between wiring patterns (1) and (2) shown in FIGS. 4 and 5. An ohmmeter was connected between (3) and (4). Disconnection was detected applying a direct current having a current density of $2\times10^7$ A/cm² between the electrodes, and the time elapsed until the disconnection was measured.

Figure 4:
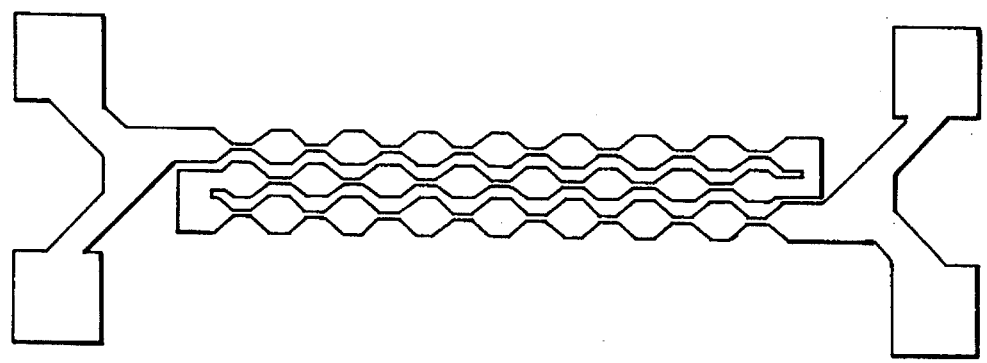
FIG. 4 is an explanatory view of the entire part of the wiring pattern for the electromigration test.
Figure 5:
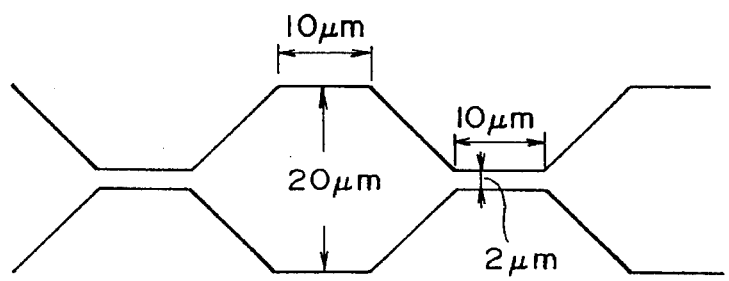
FIG. 5 is an enlarged explanatory view of the main part of the wiring pattern for the electromigration test shown in FIG. 4.

FIG. 4 is an explanatory view of the entire wiring pattern for the electromigration test, and FIG. 5 is an enlarged explanatory view of the main part of the wiring pattern shown in FIG. 4.

Stress Migration Test

Figure 1:
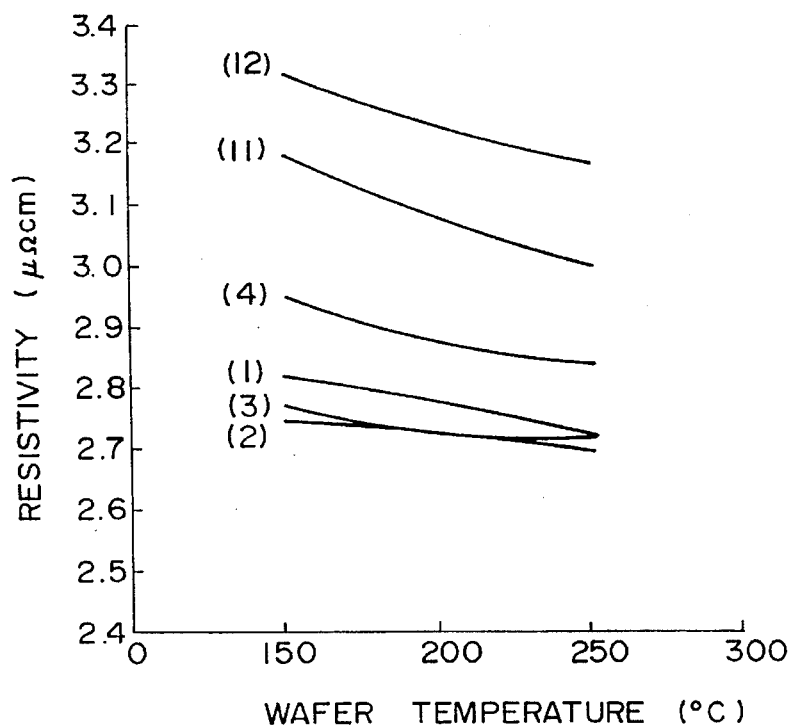
FIG. 1 is a graph showing the measured resistivities of the thin films obtained in Example and Comparative Example, wherein the ordinate represents a resistivity ($\mu\Omega m$) and the abscissa represents a wafer temperature (°C.); the curves (1) to (4) show the samples 1 to 4, respectively, in Example, and (11) and (12) show the samples 11 and 12 respectively in Comparative Example (the same in FIGS. 2 and 3).
Figure 6:
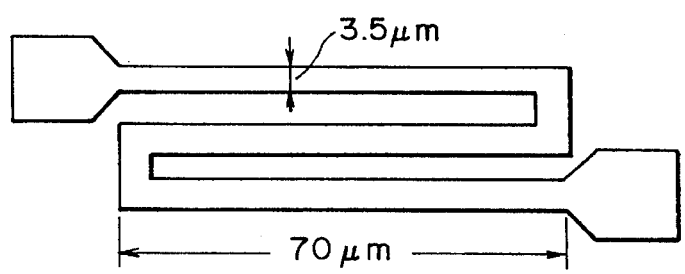
FIG. 6 is an explanatory view of the wiring pattern for the stress migration test.
Figure 7:
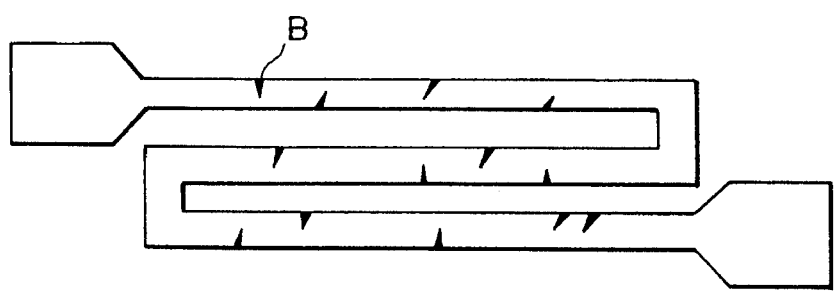
FIG. 7 is an explanatory view of the wiring pattern for the stress migration test.

A wafer (4) with a wiring pattern formed thereon was brought into close contact with a heating plate (1) shown in FIG. 1 having a convex central portion protruding from the peripheral portion by 0.2 mm, so that the wafer (4) was curved and a tensile stress was applied to the wire. Thereafter, the wafer (4) was heated at 400° C. for 5 minutes, and the number of voids produced at the portion represented by the wiring pattern (E) in FIG. 6 was counted. Only the number of voids (B) produced in the shape of a wedge on the side surfaces of the wiring layer and having a length of not less than 1 μm was measured.

Figure 8:
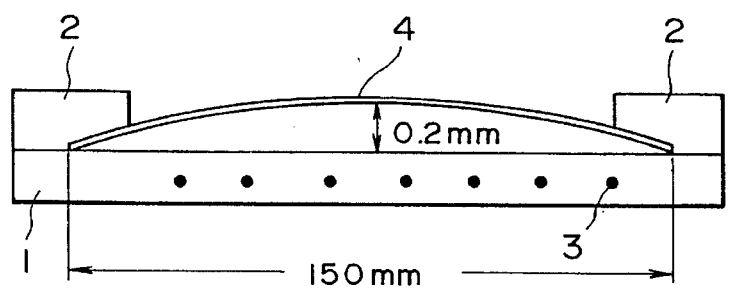
FIG. 8 is an explanatory view of a heating plate used for the stress migration test.

FIG. 8 is an explanatory view of a heating plate used for the stress migration test. In FIG. 8, the reference numeral 1 represents a heating plate, the reference numeral 2 represents a presser plate, the reference numeral 3 represents a heater and the reference numeral 4 represents a wafer, and the symbol B represents a wedge-shaped void.

Average Grain Size

A length of a line segment inclusively crossing five crystal grains was measured microscopically. One-fifth of the length was calculated as the average grain size.

Example and Comparative Example

A predetermined amount of metal element shown in Table 1 was added to a refined high-purity aluminum having a purity of not less than 99.999%, and the molten material was cast.

The ingot obtained was heat-treated at 525° C. for 12 hours, rolled at a reduction ratio of 70%, and then reheated at 425° C. for 45 minutes, thereby obtaining a material having uniform fine crystals.

Average grain sizes of materials obtained are shown in Table 1.

The material obtained was machined to produce a discal sputtering target 250 mm in diameter and 15 mm in thickness.

Each sputtering target was mounted on a magnetron sputtering apparatus MLX-3000 (produced by Ulvac Corp.) and a thin film of 1 μm in thickness was formed on the surface of a silicon wafer 6 inches in diameter with an $SiO_2$ thin film having 0.2 μm in thickness formed thereon. Thereafter, the silicon wafer was heat-treated at 450° C. for 15 minutes by lamp heating. The magnetron sputtering apparatus was operated under the following conditions.

Base pressure degree of vacuum: $6 \times 10^{-8}$ torr
Ar pressure: $4 \times 10^{-3}$ torr
Sputtering electric power: 5 kW
Wafer heating temperature: 150° C., 200° C., 250° C.

These wafer heating temperatures were the condition adopted for carrying out an acceleration test.

Each thin film obtained was subjected to the measurement of the electrical resistance, an electromigration test and a stress migration test.

Figure 2:
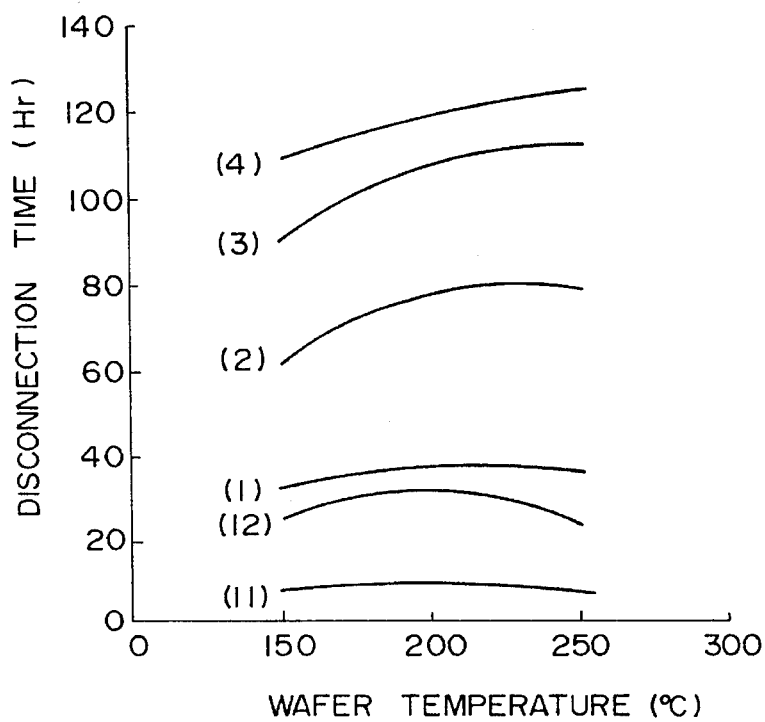
FIG. 2 is a graph showing the results of the electromigration test of the thin films obtained in Example and Comparative Example, wherein the ordinate represents a disconnection time (hour) and the abscissa represents a wafer temperature (°C.).
Figure 3:
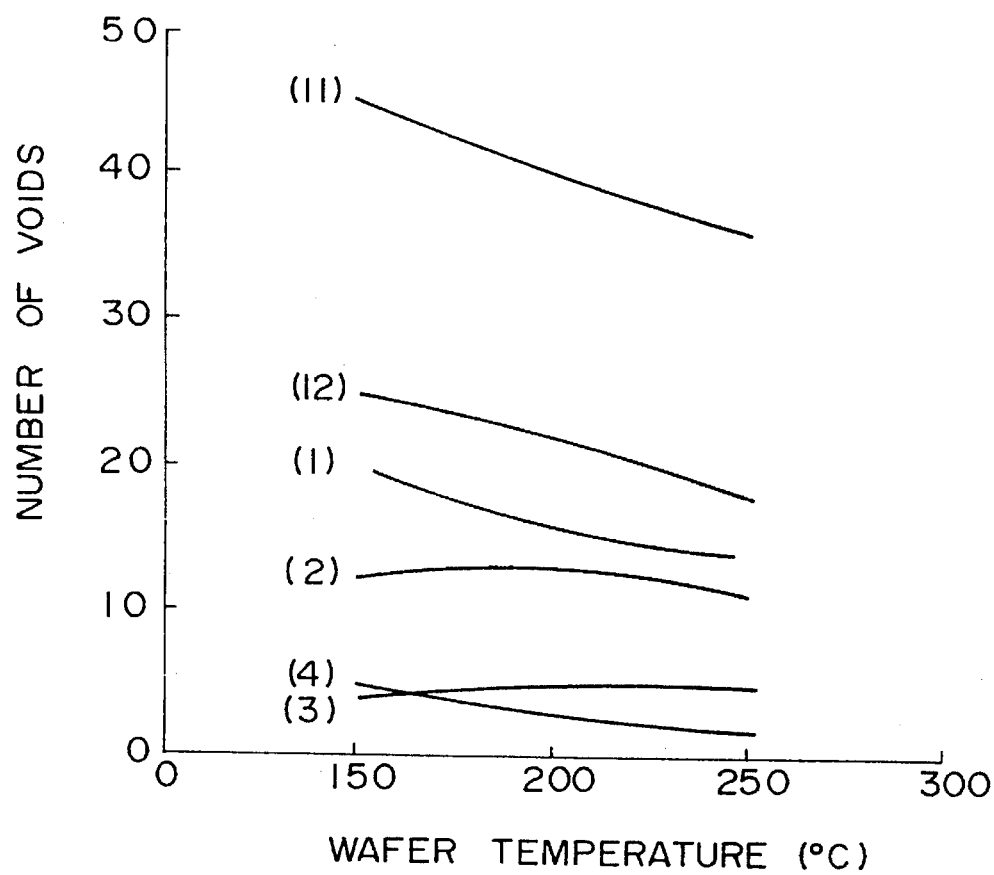
FIG. 3 is a graph showing the results of the stress migration test of the thin films obtained in Example and Comparative Example, wherein the ordinate represents the number of voids and the abscissa represents a wafer temperature (°C.).

The results are shown in FIGS. 1 to 3.

FIG. 1 is a graph showing the measured electrical resistances, FIG. 2 is a graph showing the results of the electromigration test, and FIG. 3 is a graph showing the results of the stress migration test. In these drawings, the curves (1) to (4) and (11) and (12) correspond to the sample numbers in Table 1.

The results of the measurement of the electrical resistances, the electromigration test and the stress migration test at a wafer heating temperature of 200° C. are shown in Table 1.

INDUSTRIAL APPLICABILITY

The aluminum alloy sputtering target according to the present invention has a low resistivity and takes a long time until disconnection generates. In addition, the number of voids produced is small. Thus, it is excellent as a wiring material. The wiring layer using the aluminum alloy sputtering target according to the present invention has a great resistance to electromigration and stress migration, and has a high reliability, so that it is suitable as a wiring layer for an advanced large-scale integrated circuit.

What is claimed is:

1. An aluminum alloy wiring layer consisting essentially of 0.01 to 1.0 wt % of scandium and the balance aluminum having a purity of not less than 99.99%, obtained by sputtering an aluminum alloy target produced by the steps of heating an alloy consisting essentially of 0.01 to 1.0 wt % of scandium and the balance aluminum having a purity of not less than 99.99% at 500° to 550° C. for 10 to 15 hours, subjecting the heated alloy to rolling treatment at a reduction ratio of 50 to 90%, heating the rolled alloy at 400° to 450° C. for 30 to 60 minutes, and cutting the alloy into a shape suitable for use in a sputtering apparatus.

2. An aluminum alloy wiring layer according to claim 1, wherein the scandium content is 0.05 to 0.6 wt. %.

3. An aluminum alloy wiring layer consisting essentially of 0.01 to 1.0 wt. % of scandium, 0.01 to 3.0 wt. % of at least one element selected from the group consisting of silicon, titanium, copper, boron, hafnium and rare-earth elements other than scandium, and the balance aluminum having a purity of not less than 99.99%, obtained by sputtering an aluminum alloy target produced by the steps of heating an alloy consisting essentially of 0.01 to 1.0 wt. % of scandium and the balance aluminum having a purity of not less than 99.99% at 500° to 550° C. for 10 to 15 hours, subjecting the heated alloy to rolling treatment at a reduction ratio of 50 to 90%, heated the rolled alloy at 400° to 450° C. for 30 to 60 minutes, and cutting the alloy into a shape suitable for use in a sputtering apparatus.

4. An aluminum alloy wiring layer according to claim 3, wherein the scandium content is 0.05 to 0.6 wt. %.

TABLE 1

| | Added Element (wt. %) | | | | | | | | Resistivity | EM Test*[1] | SM Test*[2] | Average grain size |
|---|---|---|---|---|---|---|---|---|---|---|---|---|
| | Sc | Cu | Si | Ti | B | Hf | Y | Ce | (μWcm) | (Hours) | (Number) | (mm) |
| EXAMPLE | | | | | | | | | | | | |
| Sample 1 | 0.05 | — | — | — | — | — | — | — | 2.78 | 38.0 | 16 | 0.42 |
| Sample 2 | 0.10 | — | — | — | — | — | — | — | 2.73 | 77.6 | 13 | 0.37 |
| Sample 3 | 0.20 | — | — | — | — | — | — | — | 2.73 | 107.8 | 5 | 0.25 |
| Sample 4 | 0.20 | 0.50 | — | — | — | — | — | — | 2.88 | 119.5 | 3 | 0.22 |
| Sample 5 | 0.20 | — | 1.00 | — | — | — | — | — | 2.74 | 110.0 | 3 | 0.20 |
| Sample 6 | 0.10 | — | — | 0.02 | — | — | — | — | 2.80 | 89.3 | 6 | 0.13 |
| Sample 7 | 0.10 | — | — | — | 0.03 | — | — | — | 2.75 | 81.7 | 10 | 0.21 |
| Sample 8 | 0.10 | — | — | — | — | 0.02 | — | — | 2.82 | 90.0 | 5 | 0.22 |
| Sample 9 | 0.10 | — | — | — | — | — | 0.05 | — | 2.88 | 97.8 | 8 | 0.34 |
| Sample 10 | 0.10 | — | — | — | — | — | — | 0.05 | 2.96 | 90.6 | 12 | 0.45 |
| COMPARATIVE EXAMPLE | | | | | | | | | | | | |
| Sample 11 | — | — | 1.00 | — | — | — | — | — | 3.08 | 10.0 | 40 | 0.25 |
| Sample 12 | — | 0.50 | 1.00 | — | — | — | — | — | 3.23 | 31.7 | 22 | 0.18 |
| Sample 13 | — | — | — | — | — | — | 0.20 | — | 3.05 | 33.4 | 30 | 0.55 |
| Sample 14 | — | — | — | — | — | — | — | 0.20 | 3.10 | 20.0 | 32 | 0.60 |
| Sample 15 | 2.00 | — | — | — | — | — | — | — | 3.31 | 30.3 | 5 | 0.30 |

(Note)
*[1]: Electro migration Test (Time elapsed until disconnection)
*[2]: Stress migration Test (Number of voids)

5. An aluminum alloy sputtering target consisting essentially of 0.01 to 1.0 wt. % of scandium and the balance aluminum having a purity of not less than 99.99%, and having an average grain size of 0.1 to 0.5 mm, obtained by sputtering an aluminum alloy target produced by the steps of heating an alloy consisting essentially of 0.01 to 1.0 wt. % of scandium and the balance aluminum having a purity of not less than 99.99% at 500° to 550° C. for 10 to 15 hours, subjecting the heated alloy to rolling treatment at a reduction ratio of 50 to 90%, heating the rolled alloy at 400° to 450° C. for 30 to 60 minutes, and cutting the alloy into a shape suitable for use in a sputtering apparatus.

6. An aluminum alloy sputtering target according to claim 5, wherein the scandium content is 0.05 to 0.6 wt. %.

7. An aluminum alloy sputtering target consisting essentially of 0.01 to 1.0 wt. % of scandium, 0.01 to 3.0 wt. % of at least one element selected from the group consisting of silicon, titanium, copper, boron, hafnium and rare-earth elements other than scandium, and the balance aluminum having a purity of not less than 99.99%, obtained by sputtering an aluminum alloy target produced by the steps of heating an alloy consisting essentially of 0.01 to 1.0 wt. % of scandium and the balance aluminum having a purity of not less than 99.99% at 500° to 550° C. for 10 to 15 hours, subjecting the heated alloy to rolling-treatment at a reduction ratio of 50 to 90%, heating the rolled alloy at 400° to 450° C. for 30 to 60 minutes, and cutting the alloy into a shape suitable for use in a sputtering apparatus.

8. An aluminum alloy sputtering target according to claim 7, wherein the scandium content is 0.05 to 0.6 wt. %.

* * * * *